United States Patent [19]

Badet et al.

[11] 4,216,577
[45] Aug. 12, 1980

[54] PORTABLE STANDARDIZED CARD ADAPTED TO PROVIDE ACCESS TO A SYSTEM FOR PROCESSING ELECTRICAL SIGNALS AND A METHOD OF MANUFACTURING SUCH A CARD

[75] Inventors: Bernard Badet, Rosny; François Guillaume, St. Leu la Foret; Karel Kurzweil, Eaubonne, all of France

[73] Assignee: Compagnie Internationale pour l'Informatique Cii-Honeywell Bull (Societe Anonyme), Paris, France

[21] Appl. No.: 931,686

[22] Filed: Aug. 7, 1978

Related U.S. Application Data

[62] Division of Ser. No. 751,954, Dec. 17, 1976, abandoned.

[30] Foreign Application Priority Data

Dec. 31, 1975 [FR] France .................... 75 40361

[51] Int. Cl.² ........................................... H05K 3/32
[52] U.S. Cl. ............................ 29/831; 156/219; 156/265; 264/263; 264/267; 264/272; 228/5.1; 29/841
[58] Field of Search .......................... 29/627, 625, 626; 156/252, 300, 265, 266, 249, 219; 264/272, 281, 271, 61; 206/329; 228/5.1; 235/61.12 C

[56] References Cited

U.S. PATENT DOCUMENTS

| 3,384,955 | 5/1968 | Pierce | 29/627 |
| 3,518,756 | 7/1970 | Bennett et al. | 264/61 |
| 3,702,464 | 11/1972 | Castrucci | 235/61.12 C X |
| 3,932,253 | 1/1976 | Elarde et al. | 156/252 X |
| 3,953,274 | 4/1976 | Winrow et al. | 156/252 |
| 3,961,413 | 6/1976 | Noe | 228/5.1 X |

*Primary Examiner*—Leon Gilden
*Assistant Examiner*—C. J. Arbes
*Attorney, Agent, or Firm*—Kerkam, Stowell, Kondracki & Clarke

[57] ABSTRACT

A standardized access card is formed of a single or a pair of bonded sheets of material including a cavity within which is disposed an integrated circuit assembly for processing electrical signals arranged within the card. The thickness of the assembly is relatively smaller than the thickness of the card and terminal areas of the assembly are accessible through cut-outs in the card which may be open or plugged with conductive material. The card may be formed in a continuous process from a plurality of strips of material which separately provide the card material, the integrated circuit assembly and a cover for the device of the circuit assembly.

11 Claims, 13 Drawing Figures

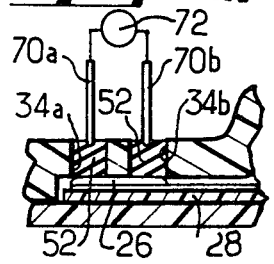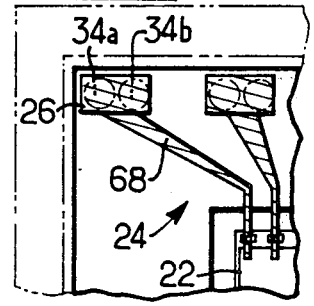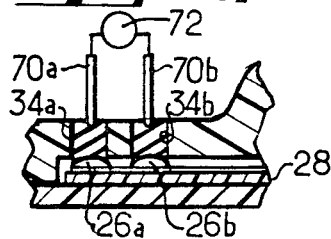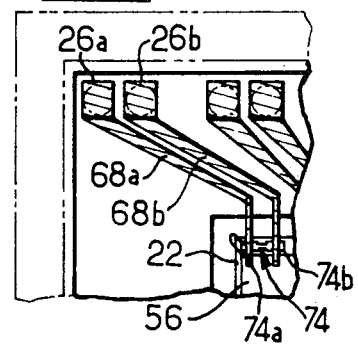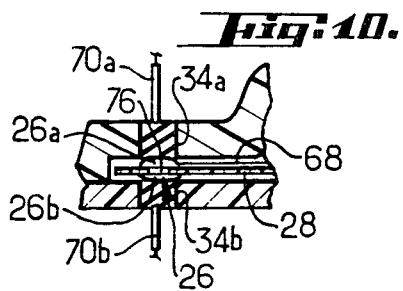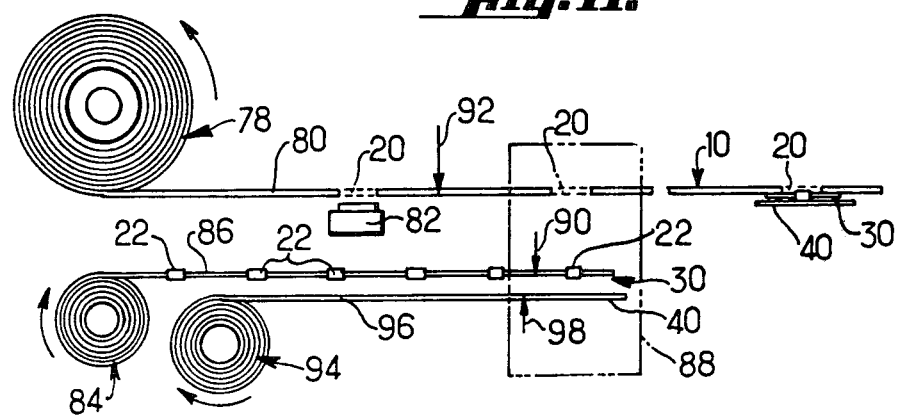

PORTABLE STANDARDIZED CARD ADAPTED TO PROVIDE ACCESS TO A SYSTEM FOR PROCESSING ELECTRICAL SIGNALS AND A METHOD OF MANUFACTURING SUCH A CARD

This is a division of application Ser. No. 751,954, filed Dec. 17, 1976 and now abandoned.

BACKGROUND OF THE INVENTION (a) Field of the Invention

This invention relates to portable cards for systems for processing signals, and to a method of manufacturing such cards.

(b) Description of the Prior Art

In most applications where an article is used to give a person private access to a system, this article more and more frequently takes the form of a portable card such is the case with credit cards, for example, which have been in use for some twenty years and are now widespread.

Recently, the International Standards Organisation laid down rules for the dimensional characteristics of credit cards (ISO/DIS standard 2894). Standard cards are to be in the shape of a rectangle 85.72 mm by 55.98 mm and 0.762 mm thick. The alpha-numeric characters which are intended for example to indicate the name and address of the person to whom the card belongs, expiry information, etc. may be embossed formations whose height relative to one of the faces of the card should not exceed approximately 0.5 mm.

In the usual present-day cards, information other than these alpha-numeric characters which is intended to give the card-holder access to a system for processing electrical signals is contained solely on prerecorded magnetic strips or bands which are attached to the card. Although what is contained on the bands may be adequate in certain applications, it is inadequate for other applications. For example, in credit card applications, it would be of great advantage to expand the information and to incorporate in the card processing circuits which are capable of dialog with the signal processing system and which may possibly include a memory. With such circuits credit cards could, in particular, perform required debit and/or credit operations in conjunction with the processing system and could record the results of these operations.

A number of trials have been carried out along these lines in which attempts have been made to incorporate an integrated circuit device in the card and have brought to light problems in such applications for credit cards. For example, small thickness (0.762 mm) called for by the international standard still has to be sufficient to accommodate an integrated circuit device capable of performing the aforementioned operations, while at the same time the card has to retain a certain amount of flexibility without jeopardizing the operation of the device.

A number of embodiments of credit card incorporating integrated circuits are known. In one such embodiment, the capsule containing the integrated circuit is connected to an array of conductors formed on a rectangular sheet of given length, the conductors terminating in contact areas which extend across part of the width of the sheet. A second sheet, of the same thickness as the capsule, contains an opening of the same length and breadth as the capsule but is not so long as the first sheet so as to leave the aforesaid contact areas exposed. This second sheet is applied to the first sheet so as to enclose the capsule. Finally a third sheet, of the same length and breadth as the second sheet, covers the second sheet and the capsule.

A drawback of this type of credit card and the method of producing the credit card is that it involves three sheets of different configurations which have to be correctly superimposed and then bonded or welded. Also, because the card must meet the standard mentioned above, the total thickness of the three sheets must not exceed 0.762 mm and the sheets thus have to be exceedingly thin, making them difficult to handle. Further the capsule necessarily also has to be very thin and special techniques have to be used for the bonding or welding.

In another known embodiment of credit cards incorporating integrated circuits, the card is produced from only two sheets. One of the faces of the first sheet is provided with an array of conductors which terminate in an equal number of external contact areas and the integrated circuit device is applied to this first sheet. The second sheet is arranged on top of it, but in order that the card will encapsulate the said device, the two sheets are made of a material which softens at high temperature. Thus, by heating the sheets to this temperature, the two sheets may be welded together with the device contained within them. This type of assembly thus calls for the use of two sheets made of a material having closely defined characteristics and then for controlled welding to take place at a high temperature. Subjecting the integrated circuit to high temperatures is undesirable in that it might affect the condition of the device.

The present invention substantially reduces or overcomes all of these drawbacks and disadvantages.

SUMMARY OF THE INVENTION

The portable card according to the invention is of the type which forms a standard credit card as defined above and which includes at least one device for processing electrical signals arranged within the card, as well as external contact terminals which are connected to the said device by an array of conductors, the card being characterised in that the said device and array of conductors rest on the same substrate, whose thickness and area are relatively smaller than those of the card, in that the device is accommodated in a cavity in the card, and in that the said contact terminals are formed by terminal areas of the said conductors of the array accessible through cut-outs in the card.

Thus, a card according to the invention may consist of only a single sheet which has an open or closed cavity in which the device may be positioned. The fact that the device and its array of conductors are already in place on a substrate is an advantage both for the manufacturing process and its cost. Also, one of the fundamental features of the present invention is that it takes advantage of the depth permitted for the reference characters (0.5 mm) formed by embossing by having the integrated circuit device inserted in a cavity which can itself be formed by the same embossing operation as the reference characters in a part of the card where these characters are permitted to appear, or which can be encapsulated in a medium whose total thickness is equivalent to the standard thickness of the card (0.762 mm) plus the height of the characters (0.48 mm approximately).

The invention also has as an object a method of producing a card according to the invention, which is characterized in that it consists in providing a roll of a first strip whose width is at least equal to one dimension of the card, forming in this strip a plurality of equally spaced cavities, providing a series of substrates each incorporating an integrated circuit device and a conductor array, inserting one of each of said substrates into a corresponding one of each of the cavities as the said strip unrolls, attaching each substrate to the strip, and cutting a card containing at least one of said substrates from the strip.

The method is thus simple. It employs only proven techniques. For example, each substrate may originate or be fed from one and the same strip or roll which carries a series of conductor arrays provided with their corresponding integrated circuit devices. In addition, this substrate, which for the most part will occupy only a small area in comparison with the total area of the card, may be easily and effectively welded by known high frequency welding techniques. It will also be seen that conventional bonding methods are equally advantageous.

BRIEF DESCRIPTION OF THE DRAWINGS

The features and advantages of the present invention will become more readily apparent from the following description, particularly when taken with reference to the accompanying drawings, which illustrate various embodiments of a card according to the invention.

In the drawings, wherein like reference characters represent like elements throughout the several views:

FIG. 8a is a cross-section of a card according to the invention at the region where the external contact terminals of the signal processing device incorporated in the card are situated.

FIG. 8b is a view of part of the substrate in an arrangement as shown in FIG. 8a;

FIGS. 9a and 9b are views similar to FIGS. 8a and 8b, respectively, illustrating a modified embodiment of contact terminal according to the invention;

FIG. 10 is a cross-section of another modified embodiment of contact terminal, and FIG. 11 is a schematic illustration of an apparatus used for producing a card according to the invention.

DESCRIPTION OF THE PREFERRED EMBODIMENTS

The embodiment considered in the following description is a standard credit card as defined by the International Standards Organization (IOS/DIS standard 2894). Because of the above-mentioned restrictions imposed by standardization, it is an excellent example for bringing out the features and advantages of the present invention.

Figure 1:
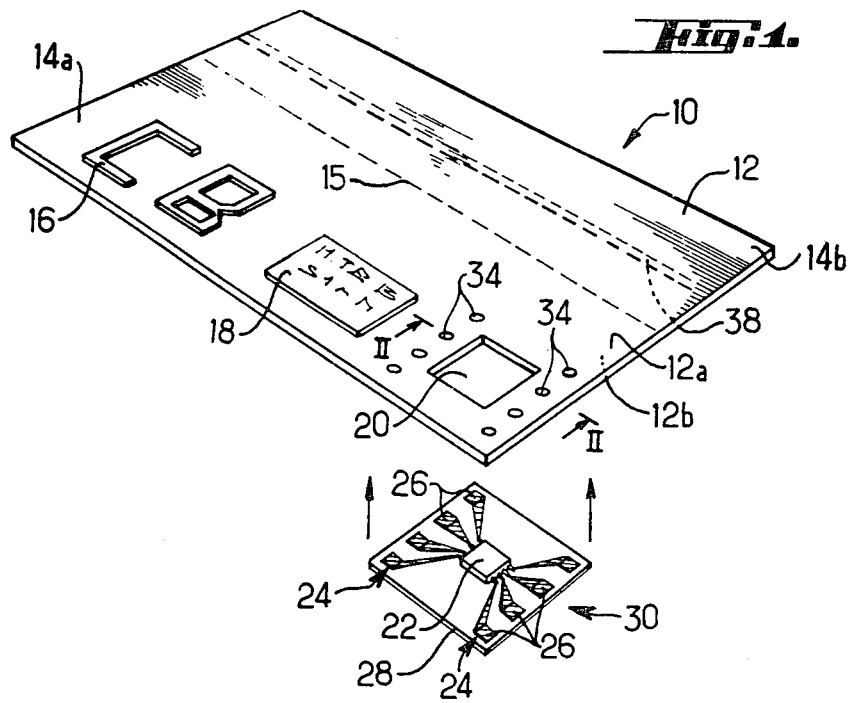
FIG. 1 is a separated perspective view of one embodiment of a card in accordance with the present invention.
Figure 2:
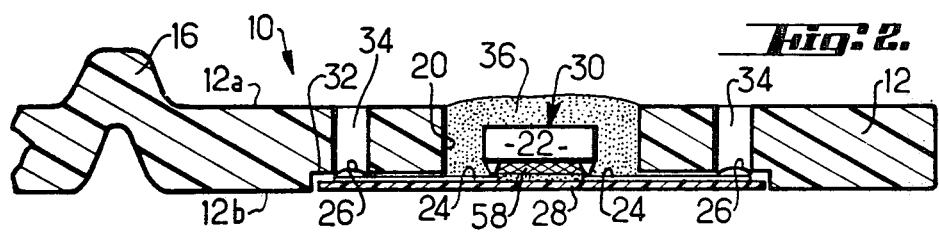
FIG. 2 is a fragmentary cross-section of the card of FIG. 1 taken on line II—II of FIG. 1.

Reference will first be made to FIGS. 1 and 2. In these Figures, the card 10 according to the invention is formed by a rectangular sheet 12 which meets the above-mentioned international standard, i.e. it is 85.72 mm long, 53.98 mm wide and 0.762 mm thick and the material of which it is made is laminated PVC (polyvinyl chloride) or PVCA (polyvinyl chloride acetate), or a material which has equivalent or superior working characteristics and is suitable for embossing.

In accordance with the standard, a part 14a of the card contained between one of its long sides and a boundary 15 parallel thereto, which is represented by a broken line in FIG. 1, is set aside to carry reference data, such as the name and address of the card-holder for example. This reference data may be alpha-numeric characters formed by embossing, such as the reference characters 16 which are shown in FIGS. 1 and 2. The reference data may also be written on a thin element, which may be made of paper or the like for example, which is bonded to part 14a of the surface of the card 10, such as the element 18 shown in FIG. 1. Or the reference data may be a combination of both. In any case, the standard requires that the reference data, be it characters 16 or the bonded-on elements 18, should not exceed a height of approximately 0.5 mm from the upper face 12a of the card 10 on which the reference data is to appear. The permitted height of the characters is thus substantially equal to two thirds of the thickness of the sheet 12.

In accordance with the invention, the sheet 12 is provided with a cavity 20 which, in the present embodiment, is a hole passing through the sheet. This hole is shaped to receive a device 22 for processing electrical signals. This device is connected to an array 24 of conductors which are provided with respective terminal areas 26.

According to the invention, the device 22 and the array 24 rest on one and the same substrate 28 and form an integrated circuit assembly 30. The assembly 30 as shown in FIG. 2 is of relatively smaller thickness than the sheet 12 forming the card and of relatively smaller area than this sheet. As an example, the assembly 30 may be of the type described in French Pat. No. 2 205 800, all of which are assigned to the assignee of the present application.

Referring to FIG. 2, it will be seen that the hole 20 opens into a shallow depression 32 formed in the lower face 12b of the card. The geometric shape of the depression 32 corresponds to that of the substrate 28 but it is slightly larger in area. Its depth is so calculated that the substrate fits into the depression with one of its surfaces flush with face 12b.

In addition to hole 20, cut-outs 34 are formed in the card at the regions where the terminal areas 26 of the conductors of the array 24 are situated when the substrate is in place in the card. In the present embodiment, the cut-outs are holes which pass through the sheet 12. These cut-outs are designed so that electrodes external to the card (not illustrated in FIG. 2) can extend through the cut-outs so as to come into electrical contact with the terminal areas 26 on assembly 30.

In the embodiment illustrated in FIG. 2, the integrated circuit assembly 30 is attached to the sheet 12 by means of an electrically insulating filling material 36 which fills the hole 20 as shown in FIG. 2. This material is substantially flush with surface 12a in the case shown in FIG. 2, but in accordance with a feature of the invention, the material may advantageously be permitted to rise to the height of the embossed formations 16. This enables devices 22 of large dimensions to be used while still keeping within the prescribed dimensions for the standard card.

It should also be mentioned that the substrate in accordance with the embodiment shown in FIG. 2, be made of a relatively stiff material. As a modification, a cover (not shown) made of a stiffer material than the substrate could be used under the conditions illustrated in FIG. 4. Without the cover, however, the substrate 28 is bonded or welded to a sheet 12 within the shallow depression 32 and its exposed face flush with base 12b.

Another fundamental feature of the present invention resides in the fact that the integrated circuit assembly 30 may advantageously be situated in a corner of the card, where any torsional stresses on the card, which is made of a relatively stiff material, are at a lower level than are exerted on the central part of the card. This advantage arises from the facts that the substrate only occupies a relatively small proportion of the card and that the terminal contacts are directly accessible to the electrodes, through the cutouts 34, with the result that the conductors do not have to extend through the card and thus make it vulnerable to any torsion or bending.

Another characteristic according to the present invention lies in the compatibility of processing by the device 22 with processing by other means such as magnetic bands or strips which can be applied in an area 14b provided for by the international standard. This area is a part of card 10 complementary to part 14a and is bounded by the broken line 15 which is marked out longitudinally on the card shown in FIG. 1. In accordance with existing practice there is shown at 38 such a magnetic band, which is generally joined to the lower face 12b of the card. In the example shown in FIG. 1, it can be seen that neither the device 22 nor the conductors in array 24 can, in a card according to the invention, interfere with the zone intended for information recorded on the magnetic band.

Figure 3:
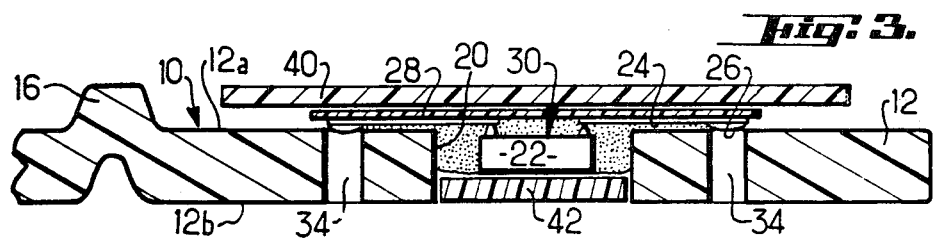
FIG. 3 is a cross-section of an alternate embodiment of a card in accordance with the present invention.

FIG. 3 shows a modified embodiment of card according to the invention in which the integrated circuit assembly 30 for the processing device 22 is situated on face 12a of the card 10 rather than on the opposite face, as in the case of FIG. 2. This arrangement has several advantages over that which has just been described. In view of the permitted height which is available above face 12a of the card 10 under the provisions of the international standard, it is no longer necessary to form a depression such as the depression 32 shown in FIG. 2, and it is even possible for a cover 40, which is formed for example from a stiffer material than that which constitutes substrate 28 of assembly 30, to cover the whole assembly and to protect it more satisfactorily. The result is easier construction and better protection. In addition, it will be noted that the cut-outs 34 provided for electrical connections external to the card open onto the lower face 12b of the card. This in no way affects the accessibility of the device 22 to the external electrical signal processing system with which the card is intended to communicate.

A plug 42 may be utilized to close the hole 20 on that face which is opposite to the face on which the assembly 30 is arranged. Such a plug could, of course, also have been used in the case of the card shown in FIG. 2, and it should be readily apparent that the embodiments illustrated are considered merely as non-limiting examples.

It should also be noted that, although not shown so that the drawings remain clear, the cover 40 is welded or bonded to the card 10 in a conventional manner.

Figure 4:
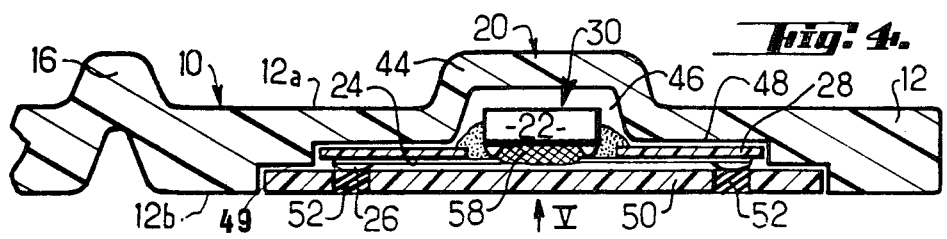
FIG. 4 is a cross-section of still another embodiment of a card in accordance with the present invention.

In the embodiment shown in FIG. 4, the cavity 20 does not extend entirely through the card as in FIGS. 1-3, but is an embossed formation 44 of the sheet 12 forming the card 10. The height of this embossed formation is such that the exposed area or face of the formation is not higher than the maximum height allowed for embossed formations so as to satisfy the standard, that is to say it is at most equal to the height of the embossed formations 16 (0.5 mm approximately). Since this height represents approximately two-thirds of the thickness of the card, the additional room afforded by this embossed formation is far from negligible and offers many advantages. The device 22 is accommodated in the cavity 46 created by the embossed formation 44, whilst a first inset step or depression 48 is provided to receive and hold the substrate 28 of assembly 30. As in the case of FIG. 3, a cover 50 equivalent to the cover 40 in FIG. 3, may likewise be provided to stiffen the assembly. Cover 50 is advantageously secured in a second inset step or depression 49.

An integrated circuit assembly 30 similar to that illustrated in FIGS. 1 to 3 could be used, the consequence of which would be to cause the cut-outs 34 to open onto face 12b of the card. However, FIG. 4 illustrates another method of construction which may be adopted. In the case shown in FIG. 4, the device 22 and the array 24 of conductors are no longer both arranged on the same face of the substrate as is the case in FIGS. 1 to 3, but are now arranged one on either side of the substrate, as is more clearly shown in FIG. 5. In conjunction with this arrangement, cover 50 contains the contact cut-outs 34. However, to prevent matter such as dust or other very fine debris from collecting in cut-outs 34 and interfering with the electrical connection which provides the link between the device 22 and the processing system to which it is intended to be connected, these cutouts may be filled with an electrically conductive material 52. This material may in particular be a lead-tin alloy or a conductive polymer for example.

Figure 5:
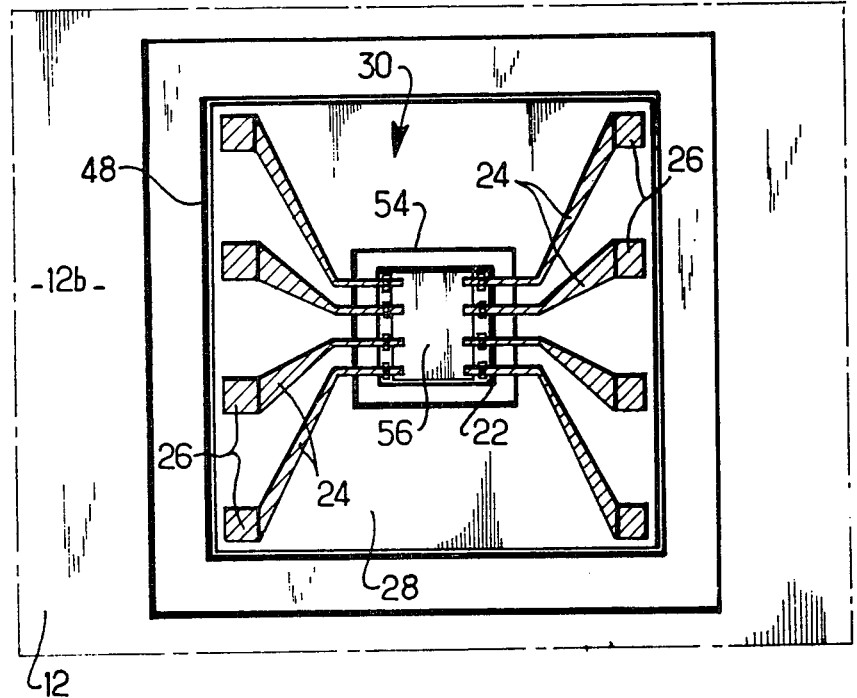
FIG. 5 is a view taken from below the card shown in FIG. 4 with the cover 50 removed.

FIG. 5 is a view from below of the card illustrated in FIG. 4, with the cover 50 removed. In this embodiment the substrate of the assembly 30 contains a rectangular central opening 54 into which the conductors of array 24 extend. The respective output contacts of the electrical or electronic circuits 56 incorporated in device 22 are positioned against the extended portions of these conductors.

The arrangement shown in FIGS. 1 to 3 differs from that of FIG. 5 in that there is no opening 54 and in that the combination formed by device 22 and array 24 is arranged on one and the same side of the substrate, the device being attached mechanically to the said substrate by the face which carries the circuits or by its opposite face, by some means other than the electrical connections of the device. The advantage offered by the assembly 30 in the cards shown in FIGS. 2 and 3 lies in its simple construction and improved reliability, which can be further increased by applying over the surface of the circuits of device 22 a substance which cannot be removed from the device without impairing the operation of circuits. This is a sure means of preventing fraud. This substance is shown at 58 in FIGS. 2 and 4, for example, as a cross-hatched area situated immediately below device 22, and in FIG. 6 as a cross-hatched area situated immediately above device 22.

Figure 6:
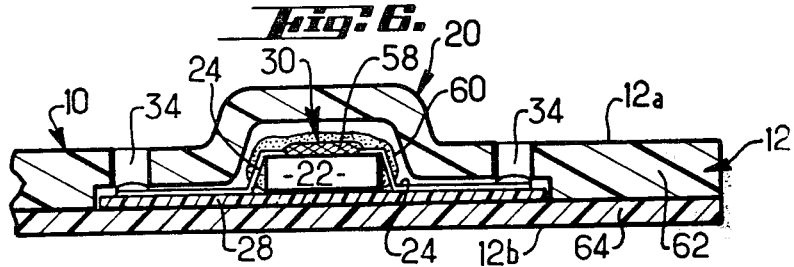
FIGS. 6 and 7 are cross-sections of further embodiments of a card according to the invention.

In the context of what has just been described, FIG. 6 shows a modified embodiment which employs an assembly 30 wherein a device 22 is attached to array 24 by the face which carries the electrical or electronic circuits. This being the case, the conductors in array 24 have to be bent so as to reach up to the level of the upper face of the device, where the processing circuits are situated. Such being the case, the device and the conductor array are both on the same side of the substrate 28. Also present in the card of FIG. 6 is once again the substance 58 which cannot be removed from the device without impairing the operation of the circuits. An optional embedding material enclosing the device 22 is shown at 60, as it also is in the case of all the other Figures.

A new feature also becomes apparent in the case of the card of FIG. 6, namely that instead of a single sheet, it is not now composed of two sheets 62 and 64. As can be seen, the assembly 30 is inserted between these two sheets, the sheet 62 having previously been embossed. In manufacture, the two sheets 62 and 64 are bonded or welded together.

Figure 7:
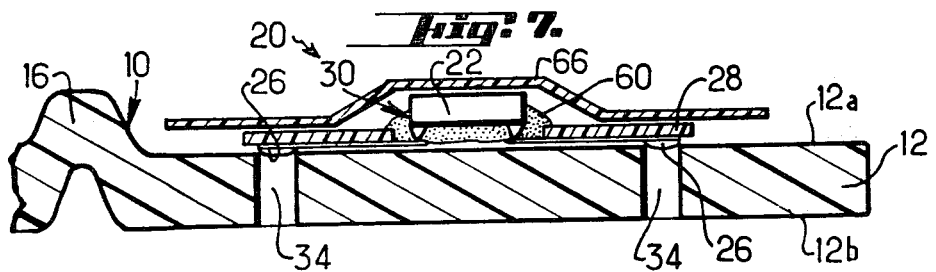

FIG. 7 shows yet another embodiment according to the invention. This card again uses only a single sheet 12 which is merely perforated to form the cut-outs 34 for the contacts. The assembly 30 as shown in FIG. 5 is placed against face 12a of the sheet. A cap 66 covers the device and the substrate. For this purpose, the cap is slightly embossed in such a way that, once welded to sheet 12, the thickness of the card at the point where the device is situated will at most be equal to the thickness at the point where the embossed formations 16 are situated.

All the embodiments which have just been described are of course merely illustrations of the various possibilities offered by an arrangement according to the invention. It is clear that combinations thereof also fall within the spirit and scope of the invention.

The invention also provides means which ensure a good electrical connection between the device 22 of the card and the system which is required to co-operate with the card and the testing of the electrical connection. FIGS. 8 to 10 illustrate various different means of providing this assurance.

In the arrangement in FIGS. 8a and 8b one and the same conductor 68 from the array 24 associated with device 22 co-operates with two contact cut-outs 34a and 34b which face a wide contact area 26. Thus, two electrodes 70a and 70b are required to test the contact between each conductor 68 and the processing system (not shown) with which the card is associated. A source 72 connected to the said electrodes 70a and 70b applies a predetermined voltage across these two electrodes. If the contact is satisfactory, a predetermined current should flow through the two cut-outs 34a and 34b and the terminal area 26.

The arrangement shown in FIGS. 9a and 9b makes it possible for poor contacts which may occur in the card to be detected in a more satisfactory fashion. In this case, each conductor 68 in the array 24 is split into two conductors 68a and 68b which communicate, via their terminal areas 26a and 26b, with respective cut-outs 34a and 34b formed in the card 10. At the device 22, the external terminals of the electrical or electronic circuits 56 are contacts 74 which are themselves split into terminals 74a and 74b, to which conductors 68a and 68b are respectively connected. Terminals 74a and 74b are joined by a conductive link or bridging connector as most clearly shown in FIG. 9b.

By applying a voltage across the conductors from the voltage source 72 via the electrodes 70a and 70b and the cut-outs 34a and 34b, a current which should exceed a certain predetermined level should flow along a path consisting of terminal area 26a, conductor 68a, contact 74a, the link connection between contact 74a and contact 74b, contact 74b, conductor 68b, terminal area 26b, and cut-out 34b. In this way, it is made certain that all the connections to device 22 are good.

FIG. 10 shows another embodiment in which each conductor 68 ends in a terminal area 26 which is carried through the substrate 28 by means of an opening 76 therein so that there are two terminal areas 26a and 26b one on each of the two faces of the substrate. Two cut-outs 34a and 34b are connected to areas 26a and 26b respectively and thus, by applying a predetermined voltage to electrodes 70a and 70b, a current higher than a given level should flow if good contact is being made.

FIG. 11 is a diagrammatic view of an apparatus which may be used to produce a card according to the invention. This apparatus will be used to demonstrate a method which can be adopted to manufacture the card.

This method consists firstly in providing a first roll 78, of a first strip of material 80, whose width is at least equal to one dimension of the card, that is to say its length or breadth. This first strip is advantageously made of the material for the card and if the card consists of only a single sheet the thickness of the strip 80 will be the same as the standard thickness of the card.

Whilst the strip 80 is unrolled, a forming device 82 forms a plurality of equally spaced cavities 20 therein. As has been seen, these cavities may be holes or embossed formations. They are represented by broken lines in FIG. 11.

On a different side, a second roll 84 consists of a second sheet 86 which contains a series of integrated circuit assemblies comprising devices 22 provided with their arrays 24 of conductors. This strip is in accordance with the patent and patent applications of applicants' assignee which were mentioned above.

An assembly apparatus 88 cuts (represented by arrow 90) the second strip 86 so as to cut off an assembly 30 as described above. This apparatus is also responsible for inserting or positioning a device 22 into each of the cavities 20 as the strip 80 unrolls, and for joining each assembly 30 to the strip 80. After strip 80 has been cut as indicated by arrow 92, and an assembly 30 joined thereto by apparatus 88, a card 10 according to the invention finally emerges.

A third roll 94 of a third strip 96 may possibly be used to form the aforementioned cover 40 or 50, the third strip 96 is cut as indicated by arrow 98 in apparatus 88. The combination of cavity 20, assembly 30 and cover 40 is schematically illustrated in the card 10 emerging from apparatus 88.

In other cases, the third roll may from the second sheet 64 when the card to be produced is of the type illustrated in FIG. 6.

It should of course be mentioned that apparatus 88 may equally well employ both bonding and welding to join together the constituent parts of the card, as was stated above.

It is a fact that, in view of the small extent of the assembly 30 and/or the cover 40 or 50 in comparison with the card 10, it can effectively be welded by its edges using conventional and proven welding techniques, such as high frequency welding these same techniques cannot efficiently be used in the welding of large surfaces which occupy for example substantially the whole area of the card. This is one of the major advantages which the invention has over the prior art.

The invention is not of course in any way limited to the embodiments described and illustrated, which have given merely by way of example, but embraces all means forming technical equivalents of the means described, and combinations thereof, if these are employed in accordance with its general purport and are made use of within the context of the following claims.

We claim:

1. A method of producing cards adapted to provide access to a system for processing electrical signals, comprising: providing a plurality of sheets, each having at least one cavity and being of a predetermined surface area and thickness and having associated contact positions adjacent said cavity, providing a plurality of integrated circuit assemblies each including a substrate having a surface area and a thickness substantially smaller than said predetermined surface area and thickness of said sheets and carrying at least one circuit device and an associated array of conductors, inserting each of said integrated circuit assemblies into a corresponding one of said cavities, and attaching the conductors of each of said assemblies to associated contact positions on the corresponding one of said sheets to thereby form said card for processing electrical signals.

2. A method according to claim 1, wherein said sheets are cut from a first strip.

3. A method according to claim 1, wherein said integrated circuit assemblies are cut from a second strip.

4. A method according to claim 1, wherein the step attaching said assemblies to the corresponding one of said sheets comprises the step of closing said cavity with a cover means.

5. A method according to claim 4, wherein the said cover means are cut from a third strip.

6. A method according to claim 2, wherein said cavities are made by embossing said first strip at regularly spaced areas.

7. A method according to claim 6, wherein each of said cavitities is formed by enclosing said integrated circuit assemblies with a cap on a face corresponding to one of said sheets.

8. A method according to claim 6, wherein each of said cavities is formed by providing at least one shallow depression in said card in addition to a major cavity, and said step of inserting includes positioning said substrate within the major cavity and said array of conductor in the shallow depression.

9. A method according to claim 7, further including forming at least one coaxial second shallow depression coaxial with said major cavity, said conductor of each said assemblies being attached to the associated contact positions through cut-outs in the corresponding sheet.

10. A method of producing cards adapted to provide access to a system for processing electrical signals, comprising: providing a plurality of sheets, embossing each said sheet to provide at least one major cavity and at least one coaxial shallow depression on one face of said sheet, said major cavity being of a predetermined depth greater than said shallow depression, providing a plurality of integrated circuit assemblies, each including a substrate having a surface area and a thickness substantially smaller than said predetermined surface area and thickness of said sheets and carrying at least one circuit device and an associated aray of conductors, inserting each of said integrated circuit assemblies with the substrate positioned in a corresponding one of said cavities and the array of conductors in the shallow depression, covering said integrated circuit with a cover and attaching the conductors of each of said assemblies to associated contact positions on the cover to thereby form said card for processing electrical signals.

11. A method according to claim 10, further including forming at least one second shallow depression coaxial with said major cavity, said conductor of each said assemblies being attached to the associated contact positions through cut-outs in the corresponding cover, said cover being positioned in said second shallow depression.

* * * * *